United States Patent [19]

Campbell

[11] 4,423,488
[45] Dec. 27, 1983

[54] DIGITAL FILTER EMPLOYING PROM FOR STORING POSITIVE AND NEGATIVE IMPULSE RESPONSE VALUES

[75] Inventor: David K. Campbell, Melbourne Beach, Fla.

[73] Assignee: Harris Corporation, Melbourne, Fla.

[21] Appl. No.: 223,572

[22] Filed: Jan. 9, 1981

[51] Int. Cl.³ .............................................. G06F 15/31
[52] U.S. Cl. ..................................................... 364/724
[58] Field of Search ......................................... 364/724

[56] References Cited

U.S. PATENT DOCUMENTS 3,872,290  3/1975  Crooke et al. ....................... 364/724
4,223,389  9/1980  Amada et al. ........................ 364/724
4,313,195  1/1982  Lehmann ......................... 364/724 X

OTHER PUBLICATIONS

Boutin et.al., "The Effect of a Realizable Integrator on a Data Signal", *Int. J. Electronics,* 1978, vol. 45, No. 6, pp. 609–619.
Peled et al., "A New Approach to the Realization of Nonresursive Digital Filters", *IEEE Trans. on Audio and Electroacoustics,* vol. AU–21, No. 6, Dec. 1973, pp. 477–484.
Jenkins, "A Highly Efficient Residue-Combinatorial Architecture for Digital Filters", *Proceedings of the IEEE,* vol. 66, No. 6, Jun. '78, pp. 700–702.

*Primary Examiner*—David H. Malzahn
*Attorney, Agent, or Firm*—Antonelli, Terry & Wands

[57] ABSTRACT

A digital filter, having a raised-cosine function in the frequency domain, is implemented in the time domain. For positive and negative impulse inputs, the time domain response of the corresponding frequency domain raised cosine response is created by way of a programmable read-only memory (PROM), the contents of which are selectively addressed by the combination of the contents of a shift register and a counter. The shift register contains a prescribed number of digital samples of successive data bits to be transmitted, while the counter is employed to identify or scan a plurality of successive finite filter response values, based upon the current contents of the shift register. From the memory locations of the PROM corresponding to successively generated address, values are read out representative of the overall or accumulated filter response attributable to the data bits stored in the shift register at the successive sample points determined by the contents of the counter.

7 Claims, 6 Drawing Figures

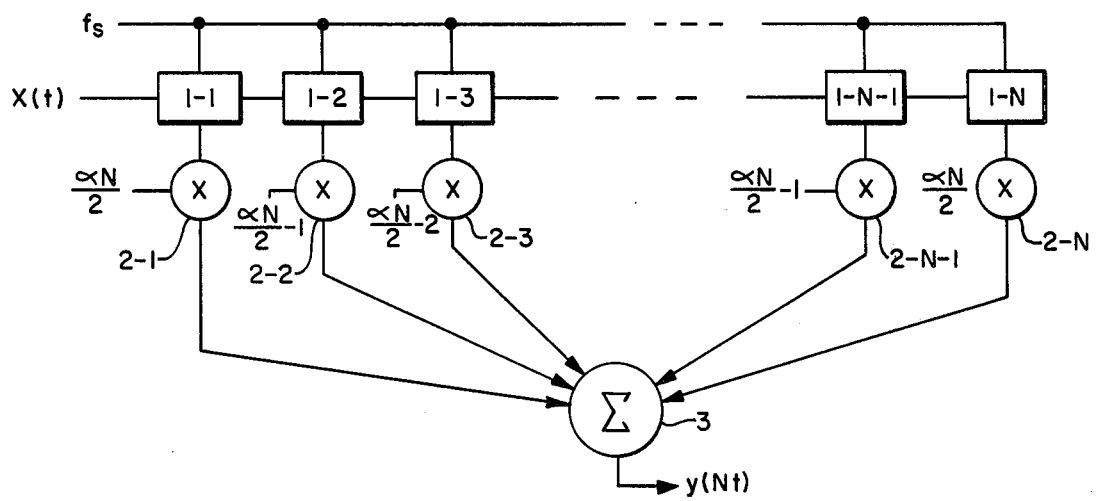
FIG. 1.
(PRIOR ART)
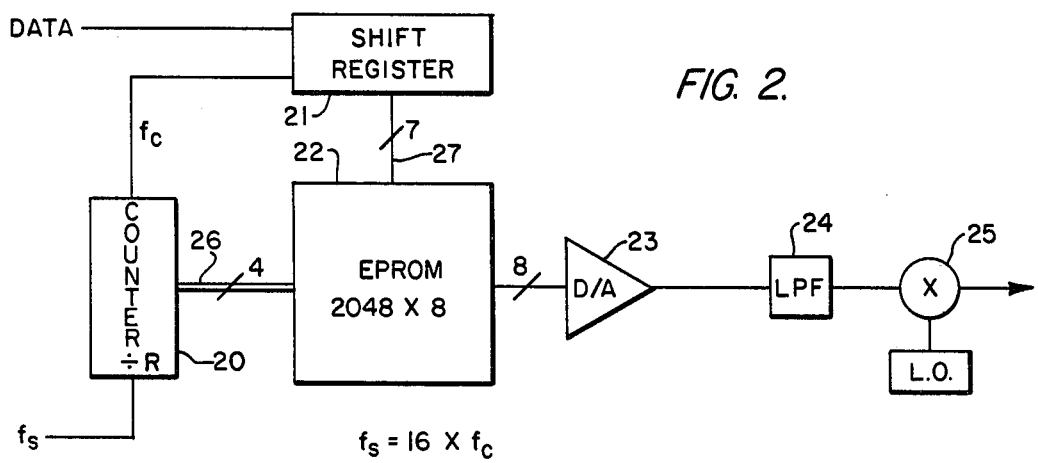
FIG. 2.
$f_s = 16 \times f_c$
FIG. 3(a)
```
1 2 3 4 5 6 7
1 0 1 1 0 1 1
```
CONTENTS OF SHIFT REGISTER 21
FIG. 3(b)
FILTER 1
FILTER 2
FILTER 3
FILTER 4
FILTER 5
FILTER 6
FILTER 7

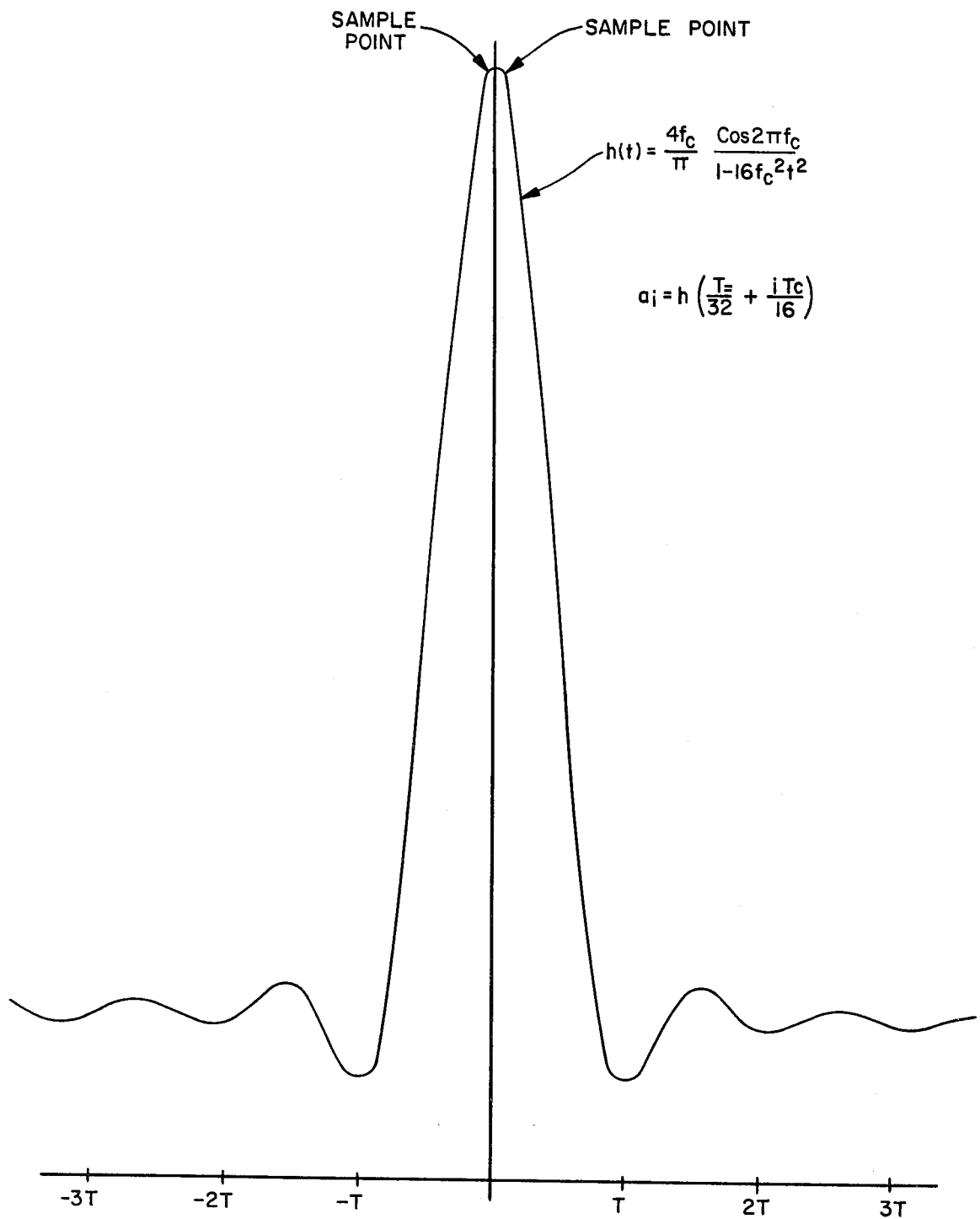

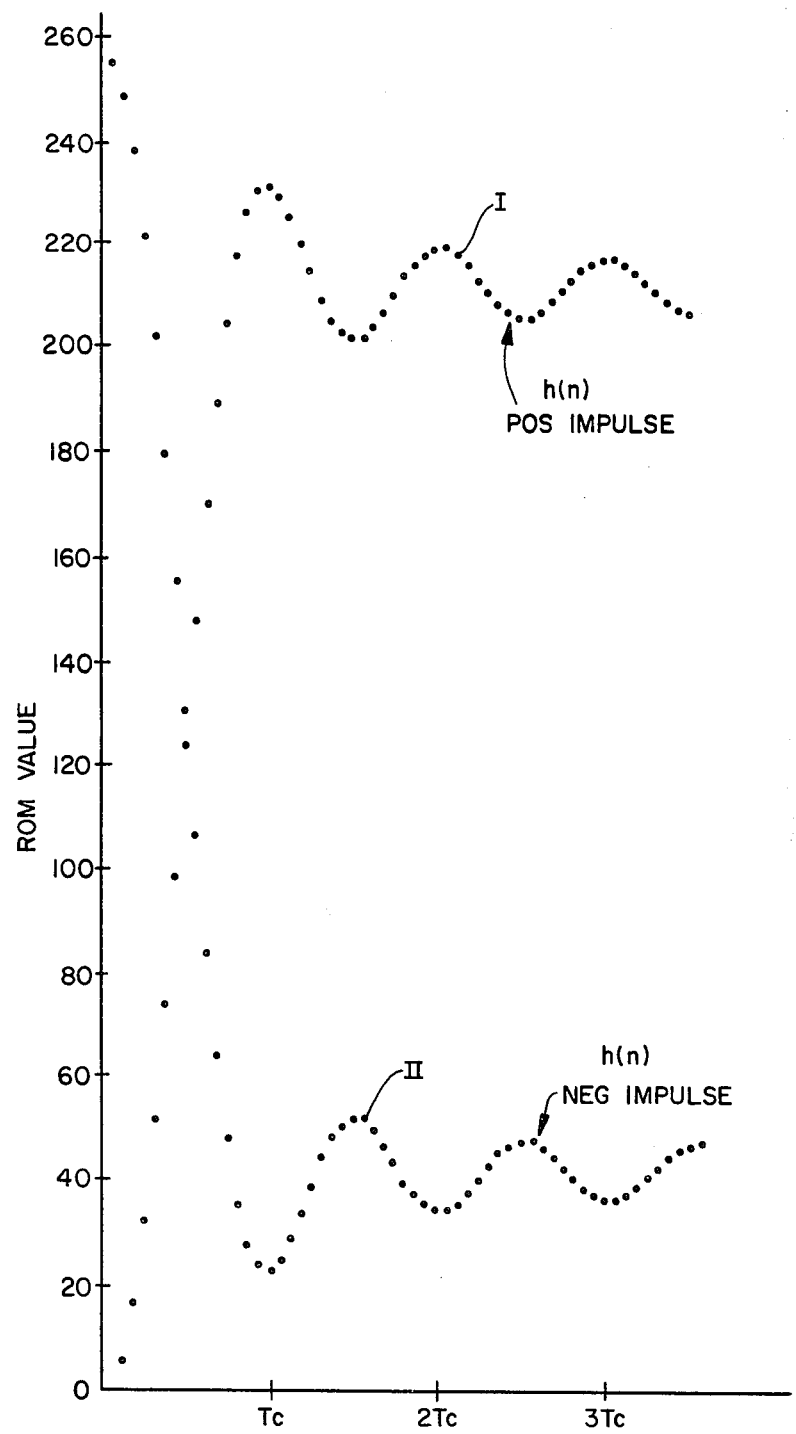

DIGITAL FILTER EMPLOYING PROM FOR STORING POSITIVE AND NEGATIVE IMPULSE RESPONSE VALUES

FIELD OF THE INVENTION

The present invention relates to communication systems, and is particularly directed to a digital filtering scheme for filtering narrow band signals such as those transmitted over a satellite communication link.

BACKGROUND OF THE INVENTION

Concomitant with the growth and expansion of satellite communication networks has been the need for filtering schemes for reducing noise and cross talk within the communication channel. Problems with narrowband satellite communication links include the significant amount of Gaussian noise encountered, the need to reduce or prevent intersymbol interference within the channel and the need to reduce cross talk from adjacent channels. For the purpose of overcoming these problems, satellite communication modems have been configured to include analog filtering schemes that typically have a Bessel function characteristic and are classically configured to as closely as possible simulate an infinite impulse response. Unfortunately, these schemes are extremely complicated and difficult to implement, requiring an inordinate amount of hardware, thereby increasing the cost of the system.

With the increasing development of semiconductor technology and sophisticated data processing techniques, proposals for reducing analog hardware complexity by replacing conventional analog filtering schemes with digital implementations have become particularly attractive. Typically, the digital filter is configured to determine the values of successive samples of a filtered output signal by forming the sums of algebraic products of successive samples of an input signal. Namely, the filter typically performs the operation so that the output sample $Y_i$ of a sampling instant i may be expressed as $$Y_i = \sum_1^N a_k \cdot x_{i-k}$$

where $\alpha$ represents a multiplication coefficient and $x_{i-k}$ represents data samples. Filters of this type are referred to as non-recursive digital filters.

Conventionally, in order to perform the filtering algorithm calculations, digital filters have been implemented in the form of a plurality of delay shift register stages, multipliers (each providing a weighing coefficient) and an adder or accumulator coupled to the outputs of the multiplier stages. In addition, there have been proposed schemes which employ programmable read-only memories, programmed with weighting coefficients, in place of the multiplier stages, with a separate adder or accumulator provided at the output of the respective ROM. For an overview of digital filtering schemes of the type mentioned above, whether they be of the recursive or non-recursive type, attention may be directed to U.S. Pat. Nos. 3,777,130; 3,737,636; 3,794,816; 3,822,404; 3,914,588; and 4,146,931, as well as an article by Peled and Liu entitled "A new Hardware Realization of Digital Filters", IEEE Transactions on Acoustics, Speed and Signal Processing, Vol. 22, no. 6, December, 1974 pp. 456–461 and an article by S. L. Freeny entitled "Special-purpose Hardware for Digital Filtering", Proceedings of the IEEE, April 1975, pp 633–648.

Unfortunately, most classical digital filtering schemes, including approaches such as those described in the above-referenced literature, have been aimed at meeting a particular frequency response. Techniques such as window functions, etc., have been devised to improve the frequency characteristics, with some degradation in the time domain response. Brute force hardware implementations, for simulating an infinite impulse response, are extremely difficult to achieve and require an inordinate amount of hardware, as mentioned previously.

SUMMARY OF THE INVENTION

In accordance with the present invention, the signal transfer function requirements of a narrowband satellite communication channel are satisfied by a filtering scheme that simultaneously reduces Gaussian noise and intersymbol interference, enjoying a linear phase response, in-band. Rather than follow the classical approach of attempting to simulate an infinite impulse response with an extremely large number of stages, whether they be of analog or digital configuration, the filtering scheme according to the present invention simulates a finite impulse response which, advantageously, obeys a transfer function characteristic that is especially suited for the types of adverse signalling influences encountered in the satellite channel, but which readily adapts itself to a simplified hardware configuration.

To this end, the filter response characteristic is one having a raised-cosine function in the frequency domain, digitally implemented in the time domain for a finite impulse response. For a finite impulse input, the time domain response of the corresponding frequency domain raised cosine response is recreated in a programmable read-only memory, the contents of which are selectively addressed by the combination of the contents of a shift register and a counter. The shift register contains a prescribed number of successive data bits to be transmitted, while the counter is employed to identify or scan a plurality of successive finite filter response values, based upon the current contents of the shift register. For this purpose, the counter divides a sampling clock signal by some preselected number that is large enough to guarantee that Nyquist's criterion is satisfied and periodically updates or shifts new data bits into the shift register. The contents of the counter represent the least significant bits of the addressed memory location in the PROM, the most or upper significant bits are represented by the contents of the shift register. From the memory locations of the PROM corresponding to these successively generated addresses, values are read out representative of the overall or accumulated filter response attributable to the data bits stored in the shift register at the successive sample points determined by the contents of the counter. Each digital data word is converted to analog form by a D/A converter and then coupled through a low pass filter for application to downstream signal processing circuitry (e.g. an I.F. mixer).

Advantageously, this scheme offers a significantly simplified hardware configuration, as the total non-recursive filter function response is derivable from a single read-only memory. By basing the simulated response upon a finite impulse input, it is a simple matter to generate the signals necessary to address or interrogate the PROM. With the raised-cosine response characteristic it has been found that the number of signal samples and sampling points can be kept at a reasonable size, so that an inordinate memory capacity is not required. In an exemplary embodiment of the invention, a 2K (2048×8 bits) read-only memory has been found to be successful.

BRIEF DESCRIPTION OF THE DRAWINGS

FIG. 1 is a schematic block diagram of a conventionally configured non-recursive digital filter;

FIG. 2 is a schematic block diagram of a non-recursive digital filter in accordance with the present invention;

FIGS. 3(a) and 3(b) are signal sample illustrations for explaining the operation of the configuration shown in FIG. 2;

FIG. 4 shows the time domain representation of the finite impulse response for a raised-cosine function; and FIG. 5 shows sample values of a raised-cosine function for positive and negative impulses.

DETAILED DESCRIPTION

As mentioned briefly above, the frequency domain response characteristic of the digital filter of the present invention is chosen to simulate a raised-cosine function, as this function has an in-band linear phase characteristic and acts to optimize, simultaneously, the problems of Gaussian noise and intersymbol interference for the narrow channel spacing of the satellite communication link. The filter is non-recursive so that it is an ideal filter for transmission filter. In order to appreciate the advantages of the digital implementation of the present invention, as contrasted to the conventional approach exemplified by those described in the above-referenced literature, consider a typical non-recursive digital filter as illustrated in FIG. 1.

The filter shown in FIG. 1 consists of a cascaded series of delay stages $Z^{-1}$, $1-1 \ldots 1-N$, to the first $1-1$ of which the incoming data samples are applied, with the contents of the stages being successively clocked along the series of stages by a sampling clock $f_s$. The contents of each delay stage are applied to a corresponding set of multipliers $2-1 \ldots 2-N$ to which there are also applied respective filter coefficients $a_{-K} \ldots a_K$. The outputs of the multipliers $2-1 \ldots 2-N$ are coupled to an adder or accumulator 3, at the output of which there is obtained the filter response $$Y_o(N\, Ts) = \sum_{i=-k}^{k} a_i x_i$$

where:
$x_i$ = data value,
$a_i = h\,(iTs)$,
$Ts = 1/f_s$ = sampling period, and
$h(t)$ = the desired filter impulse response characteristic.

As was mentioned briefly above, for a satellite communication channel the choice of a raised cosine function has particular utility, since its characteristic enables the filter to optimize both Gaussian noise and intersymbol interference. Now, with a raised-cosine spectrum chosen as the described frequency-domain filter characteristic $H(\omega)$, in the time domain, $$h(t) = \frac{4f_c}{\pi} \cdot \frac{\cos 2\pi f_c}{1 - 16 f_c^2 t^2},$$

where $H(\omega)$ is defined by $$H(\omega) = 1 \text{ for } \omega = 0 \text{ to } (1-m)\frac{\omega_c}{2}$$

$$= \cos(\omega - \alpha)\frac{\pi}{2m\,\omega_c} \text{ for } \omega = \alpha \text{ to } \alpha + m\omega_c,$$

where
$\alpha = (1-m)\,\omega_c/2$, and
$m$ = the filter rolloff (0–1).

From the above expression, the general equation for the time domain representation of the filter transfer function is $$h(t) = \frac{1}{1 - 4\,mf_c t^2}\left(\frac{\sin(1-m)\pi f_c t}{\pi t} + \frac{4 m f_c}{\pi}\cos(1+M)\pi f_c t\right)$$

To provide linear phase and satisfying Nyquist's criterion, a symmetric (even) filter with an even number of sample points may be employed. The expression for the filter coefficients is $$h(k) = h_I(TsK - Ts/2),$$

where $K = 1 \ldots N/2$ and, $$Ts = \frac{1}{2\pi\omega_s},$$

with $h_I(t)$ being defined from the above expression for $h(t)$. For such a filter, the frequency domain representation of the transfer function is $$H(\omega/\omega_s) = 2 \sum_{k=1}^{N/2} h(k) \cos 2\pi (k - \tfrac{1}{2})\omega/\omega_s$$

where
$\omega_s$ is the sampling frequency and
$N$ is the number of stages of the filter.

Unfortunately, a conventional implementation approach as illustrated in FIG. 1 cannot be made to match the desired cosine response exactly, since the filter has a finite impulse response and, therefore, an infinite frequency response. Increasing the number of stages and the ratio of the sampling (shift) clock $f_s$ to the data clock $f_c$ can improve the approximation; however, it will only be that, an approximation and not an exact match.

Now, consider inserting an impulse generator (e.g. a clocked flip-flop) for each delay stage of the configuration of FIG. 1, creating a shift register of some number of stages, where each impulse is one sampling period Ts wide, so that, for a binary representation, a positive impulse may be represented by a binary "1" and a negative impulse by a binary "0". Each output $Y(nTs)$ of the "modified" classical approach contains $$\frac{N}{f_s/f_c}$$

terms because of the insertion of the impulse generator; i.e. there are impulses in the shift register at any time. As explained above, the impulse (positive or negative) may be represented by a binary function, so that there are $2^{(N/fs/fc)}$ unique impulse patterns that may be realized or generated for the filter.

By letting $f_s/f_c = R$, there are $2^{(N/R)}$ unique patterns, each pattern thereby producing R outputs (Y(nTs)). Once these patterns have been read out, a new data sample x (t) is loaded into the first stage of the shift register as the contents of the other $Z^{-1}$ stages are shifted. With this functional approach, there are at most $R \cdot 2^{(N/R)}$ unique filter outputs Y (nTs) for any n length finite impulse response shift register having an impulse generator configuration. These Y(nTs) can be stored in a read only memory and accessed by an address code, the most significant bits are defined by the contents of the shift register and the least significant bits (defining the sampling points) are defined by a binary code representative of fs/fc or R.

FIG. 2 is a block-diagram illustration of a non-recursive digital filter in accordance with the present invention incorporating the above approach. Incoming data x(t) is coupled to an N stage shift register 21, and is clocked in at a shift clock rate determined by the output of a counter or divider 20. Counter 20 divides an incoming sampling clock signal $f_s$ by a factor of R to obtain a data clock frequency $f_c$ for successively loading data into shift register 21. Letting R=16, counter 20 may be a four stage binary counter, the contents of the respective stages of which are coupled over link 26 to the LSB portion of the address input to PROM 22. Link 26 is Y bits wide where $$Y = \frac{\ln R}{\ln 2}$$

so that here Y=4. The MSB address bits are derived from the R stages of shift register 21, so that for a seven stage register, Y(4)+N(7)=11 bits defining a memory address in PROM 22. PROM 22 may be a commercially available EPROM having a (2048×8) bit capacity. The output of PROM 22 is an eight bit word representation of the filter response Y for a data sample pattern contained in shift register 21 and a sampling point specified by the contents of counter 20. This filter output value Y(t) is then converted into analog form by a D/A converter 23 and coupled through a low pass filter 24 to downstream conversion circuit, such as a mixer 25, for converting the signal from baseband up to I.F., for example.

As will be readily understood from a comparison of the configuration shown in FIG. 2 to the digital filter configurations depicted in the above-referenced literature, the implementation scheme of the present invention is extraordinarily simplified compared with conventional approaches. In order to fully appreciate how the PROM is programmed to perform its intended response function, consider the set of finite filter responses shown in FIG. 3(b). As each new data sample value is loaded into shift register 21, the contents of the shift register will take on some arbitrary sequence as governed by the N=7 most recent data samples. FIG. 3(a) illustrates a binary sequence representative of the contents of shift register 21 for some arbitrary series of values 1011011. Each of these values is shifted in time by the period of the data clock from its adjacent value, and may be employed to generate, or determine, a finite impulse response for a filter having the desired spectrum characteristic (here a raised cosine function has been chosen). By considering each sample value individually and ignoring adjacent values, there may be derived a filter characteristic response function such as illustrated in FIG. 3(b). Here a one bit value represents a positive impulse response, while a zero bit value represents a negative impulse response.

FIG. 4 illustrates in greater detail the time domain characteristic curves of the raised cosine finite impulse response, described above, whereas the response impulse curves shown in FIG. 3(b) are reduced for simplicity of illustration. As shown in FIG. 4, the raised-cosine response undergoes a significant variation over the centroid of the sampling window +T about the peak, but tapers off after several such intervals.

FIG. 5 shows the raised cosine characteristic of FIG. 4 for both positive and negative impulses, sampled at 16 points per sampling interval, using an amplitude value scale of eight bits, so that the number 256 represents the maximum peak value attributable to the response at the centroid of the curve. Curve I illustrates sampled response values for a positive impulse while curve II shows the sample response values for a negative impulse. While, in reality the values are determined over the entire seven sample span of shift register 21, the values for only a three symbol span form are shown in FIG. 5 to simplify the drawings. (As it turns out, the contribution after three to four bit periods to the eight bit number derived from the PROM becomes insignificant.) Once the response values for an individual impulse for any bit position have been calculated from the h(t) definition, it is a straightforward matter to determine the values, for the other six bit positions, simply by shifting the sample points of interest to the right or left. All of these values over the entire seven-bit span of the shift register (112 individual sample points) are summed for all seven bit state possibilities, an exemplary one of which is shown in FIG. 3(a), so as to derive 2048 response Y values, each of which is represented by an eight bit binary code. One calculated, these values are stored in the respective 2048 locations of PROM 22. Thus, for each new successive data sample clocked into shift register 21, sixteen successive filter values (covering one entire bit period) are produced by PROM 22 from its stored 2048×8 bit words, as counter 20 counts sample clock signals $f_s$. These values are then converted into analog format by D/A converter 23. Low pass filter 24 smooths the successive analog values to provide the resultant filtered output signal for subsequent up conversion and transmission.

In the foregoing example of the addressing scheme for the read-only memory 22, a sample span of seven bits with sixteen sample points per data sample, has been described for numerical values that may be used for accessing a 2K PROM. It should be understood, however, that the present invention is not limited to these parametric ranges. Other data sample spans and number of sample points may be used. Of course, although Nyquist's criterion governs sampling, it should be noted that the greater number of sample points per data bit, the greater accuracy is the filter output Y(t) for each sample point. In the present example, sixteen sample points, requiring four bits of each address word were employed. In this circumstance, the size of the PROM must be tailored to meet the sampling criterion. This may, in part, be influenced by the filtering function chosen. In the present example, considering the effects of Gaussian noise and intersymbol interference in a narrowband satellite communication link, a raised-cosine filter characteristic was selected. However, other filtering functions are adaptable to the simplified digital filtering approach employed in accordance with the present invention. Note also, that with all possible values of Y(t) for a data symbol span of interest being stored by the PROM, a change in data rate does not require a reconfiguration or recalculation of filter output values. All that is required is a change in the sampling clock frequency fs input to counter 20.

While I have shown and described one embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A digital filter comprising:
   first means for receiving and storing sequential values of an input binary data signal;
   second means coupled to said first means for producing a first clock signal in response to which said first means stores sequential values of said input binary data signal;
   third means for storing a plurality of filter output signal values each of which is representative of the sum of the values of individual positive and negative impulse response characteristics of a prescribed filter function for the sequential values of said input binary data signal stored by said first means, at each of a plurality of sampling points, over the signal value span stored thereby; and
   fourth means, coupled between said third means and said first and second means, for addressing said third means in accordance with the contents of said first and second means and thereby causing said third means to produce filter output signal values stored therein.

2. a digital filter according to claim 1, wherein:
   said second means includes means for receiving an input clock signal and producing therefrom said first clock signal, and wherein
   said fourth means includes means, coupled to said second means, for causing said third means to produce said filter output signal values in dependence upon sequential values stored by said first means and a prescribed relationship between said input clock signal and said first clock signal produced by said second means.

3. A digital filter according to claim 2, wherein:
   said second means includes counter means for counting input clock signals and producing said first clock signal upon counting a precribed number of said input clock signals, and wherein
   said third means comprises a read-only memory, the respective memory locations of which store said plurality of filter signal values, and wherein
   said fourth means includes mans for generating address signals for accessing said memory in accordance with the combination of the data values stored by said first means and the contents of said counter means.

4. A digital filter according to claim 3, wherein said first means comprises an N stage shift register into which a prescribed number of sequential values of said input binary data signal are coupled, and said counter comprises an R-stage binary counter for dividing the frequency fs of said input clock by R to produce said first clock signal by way of which sequential values of said input binary data signal are coupled into and through said shift register, the combination of the binary states of the stages of said shift register and the binary states of said R-stage binary counter defining respective addresses for accessing said read-only memory.

5. A digital filter according to claim 4, wherein each of the filter output signal values stored by said read-only memory is representative of the sum of sampled values of individual finite positive and negative impulse response characteristics for said prescribed filter function at each of the R sampling points for the N sequential values of said input binary data signal over the span of N data symbols stored by said N-stage shift register.

6. A digital filter according to claim 5, wherein said prescribed filter function has a raised-cosine filter characteristic in the frequency domain.

7. A digital filter according to claim 1, wherein said precribed filter function has a raised-cosine filter characteristic in the frequency domain.

* * * * *